(12) United States Patent
Ling et al.

(10) Patent No.: US 10,410,039 B2
(45) Date of Patent: *Sep. 10, 2019

(54) OPTICAL FINGERPRINT MODULE

(71) Applicant: SHANGHAI OXI TECHNOLOGY CO., LTD, Shanghai (CN)

(72) Inventors: Yan Ling, Shanghai (CN); Hong Zhu, Shanghai (CN); Ketao Lu, Shanghai (CN)

(73) Assignee: SHANGHAI OXI TECHNOLOGY CO., LTD, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/073,292

(22) PCT Filed: Aug. 18, 2016

(86) PCT No.: PCT/CN2016/095846
§ 371 (c)(1),
(2) Date: Jul. 26, 2018

(87) PCT Pub. No.: WO2017/166581
PCT Pub. Date: Oct. 5, 2017

(65) Prior Publication Data
US 2019/0034686 A1    Jan. 31, 2019

(30) Foreign Application Priority Data

Mar. 31, 2016   (CN) .......................... 2016 1 0200764

(51) Int. Cl.
*G06K 9/00*     (2006.01)
*G09G 3/3208*   (2016.01)
(Continued)

(52) U.S. Cl.
CPC ............ *G06K 9/0004* (2013.01); *G06K 9/00* (2013.01); *G06K 9/00053* (2013.01); *G06K 9/20* (2013.01);
(Continued)

(58) Field of Classification Search
CPC .. G06K 9/0004; G09G 3/3216; G09G 3/3225; H01L 27/3211; H01L 27/323; H01L 27/3246
See application file for complete search history.

(56) References Cited

U.S. PATENT DOCUMENTS 8,204,283 B2   6/2012   Wu
8,878,790 B2   11/2014  Abele
(Continued)

FOREIGN PATENT DOCUMENTS

CN   103942537 A    7/2014
CN   104182727      12/2014
(Continued)

OTHER PUBLICATIONS

International Search Report from PCT/CN2016/095846 dated Dec. 27, 2016.

*Primary Examiner* — Manuchehr Rahmjoo
(74) *Attorney, Agent, or Firm* — Adsero IP

(57) ABSTRACT

An optical fingerprint module includes a backlight source, an optical fingerprint sensor including a first surface, a second surface, at least one first non-opaque region and photosensitive pixels, and an OLED display panel including a third surface, a fourth surface and at least one second non-opaque region. The optical fingerprint sensor is disposed between the OLED device panel and the backlight source. Light emitted from the backlight source at least partially passes through the first non-opaque region from the first surface and reaches the second surface, transmits from (Continued)

the second surface to the third surface, passes through the second non-opaque region and reaches the fourth surface. The light reaching the fourth surface is at least partially reflected to be applied to capture a fingerprint image, the reflected light returns to the second non-opaque region, reaches the third surface, transmits to the second surface, and enters the photosensitive pixels.

16 Claims, 4 Drawing Sheets

(51) Int. Cl.
*H01L 27/32* (2006.01)
*H01L 51/52* (2006.01)
*G06K 9/20* (2006.01)

(52) U.S. Cl.
CPC ......... *G09G 3/3208* (2013.01); *H01L 27/323* (2013.01); *H01L 27/3276* (2013.01); *H01L 51/5203* (2013.01)

(56) References Cited

U.S. PATENT DOCUMENTS

| 2016/0092717 | A1 | 3/2016 | Ling | |
| 2017/0078513 | A1* | 3/2017 | Chang | G06F 3/0488 |
| 2017/0097702 | A1* | 4/2017 | Chang | G06F 3/044 |
| 2017/0193270 | A1 | 7/2017 | Zhang | |

FOREIGN PATENT DOCUMENTS

| CN | 204028936 U | 12/2014 |
| CN | 104318205 | 1/2015 |
| CN | 104463107 A | 3/2015 |
| CN | 105184230 A | 12/2015 |

* cited by examiner

OPTICAL FINGERPRINT MODULE

CROSS-REFERENCE TO RELATED APPLICATIONS

The present application is the national phase of International Application No. PCT/CN2016/095846, filed on Aug. 18, 2016, which claims the benefit of priority to Chinese Patent Application No. 201610200764.4, filed on Mar. 31, 2016, and entitled "OPTICAL FINGERPRINT MODULE", the entire disclosures of which are incorporated herein by reference.

TECHNICAL FIELD

The present disclosure generally relates to optical fingerprint identification field, and more particularly, to an optical fingerprint module.

BACKGROUND

Fingerprint imaging recognition technology is used to realize identification by capturing fingerprint images of a person using optical fingerprint sensors or modules and then determining whether the fingerprint image information matches that already stored in a system. Due to its convenience in use and uniqueness of human fingerprints, the fingerprint recognition technology has been widely applied to various fields, such as security inspection field including Public Security Bureau (PSB) or the like, access control systems of buildings, consumption goods field including personal computers or mobile phones etc., and the like. The fingerprint recognition technology may be realized by optical imaging, capacitance imaging, ultrasound imaging and the like, among which, the optical fingerprint recognition technology is advantageous in the imaging quality and device cost.

As shown in FIG. 1, an existing optical fingerprint module includes a backlight source 110, an optical fingerprint sensor 120, a protective layer 130 and a shell (not shown in FIG. 1). When a fingerprint image is captured, a finger 140 of a person is placed on the protective layer 130. An output light 111 of the backlight source 110 (upward arrows in FIG. 1 represent the output light 111, as enclosed in a dotted line frame) passes through the optical fingerprint sensor 120 and the protective layer 130, and is reflected and transmitted at a contact interface between the finger 140 and the protective layer 130. The reflected light 112 (downward arrows in FIG. 1 represent the reflected light 112, as enclosed in a dotted line frame) passes through the protective layer 130 and irradiates onto the optical fingerprint sensor 120. The optical fingerprint sensor 120 performs photoelectric conversion and signal processing by its inner circuits (not shown in FIG. 1) to realize fingerprint image capturing. Since characteristics of a contact interface between the finger 140 and the protective layer 130 reflect fingerprint characteristics of the finger, and the characteristics of the contact interface directly affect characteristics of the reflected light 112, the image captured by the optical fingerprint sensor 120 shows the fingerprint characteristics of the person.

More information on optical fingerprint modules may refer to the Chinese Utility Model Patent with a publication No. CN105184230A and a publication date of Dec. 23, 2015.

However, structures and performance of the existing optical fingerprint modules still remain to be improved.

SUMMARY

An optical fingerprint module is provided according to embodiments of the present disclosure to improve performance of existing optical fingerprint modules.

In some embodiment, the optical fingerprint module may include a backlight source; and an optical fingerprint sensor including a first surface, a second surface, at least one first non-opaque region and a plurality of photosensitive pixels. The optical fingerprint module may further include an Organic Light Emitting Diode (OLED) display panel including a third surface, a fourth surface and at least one second non-opaque region. The optical fingerprint sensor may be disposed between the OLED device panel and the backlight source. Light emitted from the backlight source at least partially passes through the at least one first non-opaque region from the first surface and reaches the second surface, transmits from the second surface to the third surface, passes through the at least one second non-opaque region from the third surface and reaches the fourth surface, where the light reaching the fourth surface is at least partially reflected to be applied to capture a fingerprint image, and the reflected light returns to the at least one second non-opaque region, reaches the third surface, transmits from the third surface to the second surface, and enters the plurality of photosensitive pixels from the second surface.

In some embodiment, an optical adhesive layer may be disposed between the second surface and the third surface.

In some embodiment, pixel sizes of the optical fingerprint sensor may be less than or equal to 100 μm×100 μm, and a distance between the second surface and the fourth surface may be less than or equal to 0.5 mm.

In some embodiment, a light collimating layer or a light focusing layer may be disposed between the backlight source and the optical fingerprint sensor, and is configured to make light transmitting to the first surface become parallel light or quasi-parallel light.

In some embodiment, an optical adhesive layer may be disposed between the second surface and the third surface, a total thickness of the OLED display panel and the optical adhesive layer may be below 5 mm.

In some embodiment, the OLED display panel may include a first substrate, a second substrate, and a stacked structure disposed between the first substrate and the second substrate.

In some embodiment, the stacked structure may include a plurality of isolated display pixels, each of the plurality of isolated display pixels may include a first electrode and a second electrode, the first electrode may be connected to an outside of a pixel region where the each isolated display pixel is disposed through a lead, and all of the second electrodes may be electrically connected together.

In some embodiment, one or more of the plurality of photosensitive pixels may exactly face one of the plurality of isolated display pixels; and when one of the plurality of photosensitive pixels exactly faces one of the plurality of isolated display pixels, an area of each of the plurality of photosensitive pixels may be equal to an area of each of the plurality of isolated display pixels.

In some embodiment, the first electrode, the second electrode and the lead may be made of non-opaque conductive materials.

In some embodiment, light emitted from the plurality of isolated display pixels may include white light, violet light, blue light, cyan light, green light, yellow light, orange light, red light, or near-infrared light; or each of the plurality of isolated display pixels may include three sub pixels, and the three sub pixels may include a red sub pixel, a green sub pixel, and a blue sub pixel respectively.

In some embodiment, the stacked structure may include a plurality of passive display pixels arranged in an array, each of the plurality of passive display pixels may include a first electrode connected with a first data line in a first axial direction and a second electrode connected with a second data line in a second axial direction.

In some embodiment, the stacked structure may include a plurality of active display pixels arranged in an array, each of the plurality of active display pixels may be connected with a data line and a scanning line.

In some embodiment, each of the plurality of active display pixels may include an element region, an electrode region and a surrounding region, the element region may be a light blocking region, and the surrounding region may be a non-opaque region.

In some embodiment, when the optical fingerprint sensor captures fingerprint, a display function of the OLED display panel may be turned off.

In some embodiment, the optical fingerprint module may further include a protective layer, where the OLED display panel may be disposed between the protective layer and the optical fingerprint sensor.

In some embodiment, a touch-sensitive layer may be disposed between the second substrate and the protective layer, or between the second substrate and the stacked layer.

Compared with the prior art, the present disclosure has the following advantages.

The OLED display panel is disposed on the optical fingerprint sensor, and the optical fingerprint sensor includes a first surface, a second surface, at least one first non-opaque region and a plurality of photosensitive pixels. The OLED display panel includes a third surface, a fourth surface and at least one second non-opaque region. Light emitted from the backlight source at least partially passes through the at least one first non-opaque region from the first surface and reaches the second surface, transmits from the second surface to the third surface, passes through the at least one second non-opaque region from the third surface and reaches the fourth surface. The light reaching the fourth surface is at least partially reflected to be applied to capture a fingerprint image. The reflected light returns to the at least one second non-opaque region, reaches the third surface, transmits from the third surface to the second surface, and enters the plurality of photosensitive pixels from the second surface. Upper positions of the plurality of photosensitive pixels correspond to lower positions of the plurality of isolated display pixels in the OLED display panel, and operating time of the plurality of photosensitive pixels and operating time the plurality of isolated display pixels are adjusted, so as to ensure that the OLED display panel can display information well, and further to ensure that the optical fingerprint sensor can capture fingerprint well. Therefore, the fingerprint capturing function and information display function can be integrated together in the optical fingerprint module, which broadens an application range of the optical fingerprint module.

Further, upper positions of the plurality of photosensitive pixels in the optical fingerprint sensor correspond to lower positions of the plurality of isolated display pixels in the OLED display panel, so as to better ensure that light emitted from the backlight source can reach the fourth surface of the OLED display panel, and the light can pass through the optical fingerprint sensor and OLED display panel more uniformly, thereby maintaining the fingerprint capturing function of the entire optical fingerprint module at a high level.

DETAILED DESCRIPTION

As described in the background art, functions of the existing optical fingerprint modules are relatively single, and applications of the existing optical fingerprint modules are subject to a certain restriction.

In view of above, an optical fingerprint module is provided in the present disclosure, where an optical fingerprint sensor and an Organic Light Emitting Diode (OLED) display panel are subtly disposed in a same module by utilizing unique properties of the OLED display panel, which not only simplifies the design structure and the corresponding manufacture process, but also provides the optical fingerprint module with an information display function, thereby making the optical fingerprint module more functional and widely applied.

The foregoing objects, features and advantages of the present disclosure will become more apparent from the following detailed description of specific embodiments in conjunction with the accompanying drawings.

Figure 1:
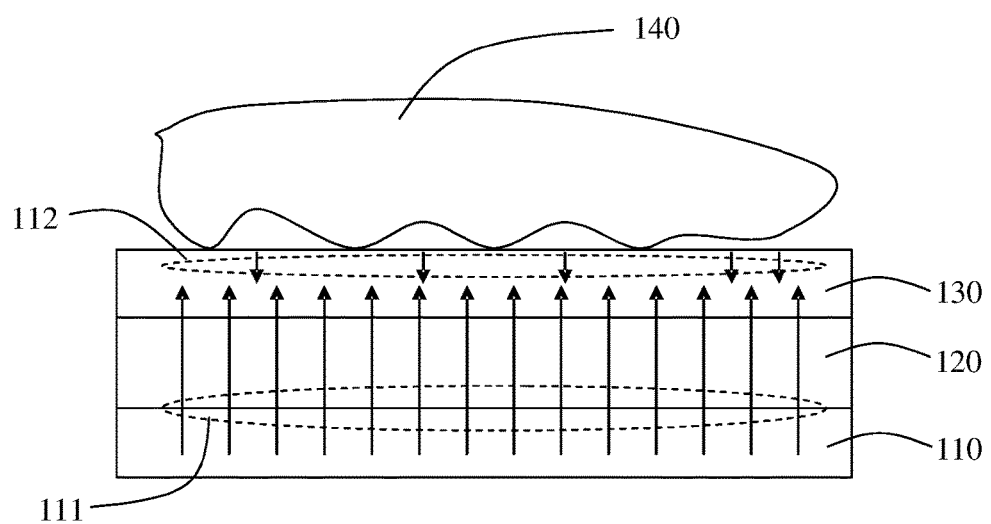
FIG. 1 schematically illustrates a structural diagram of an optical fingerprint module in an existing technology.
Figure 2:
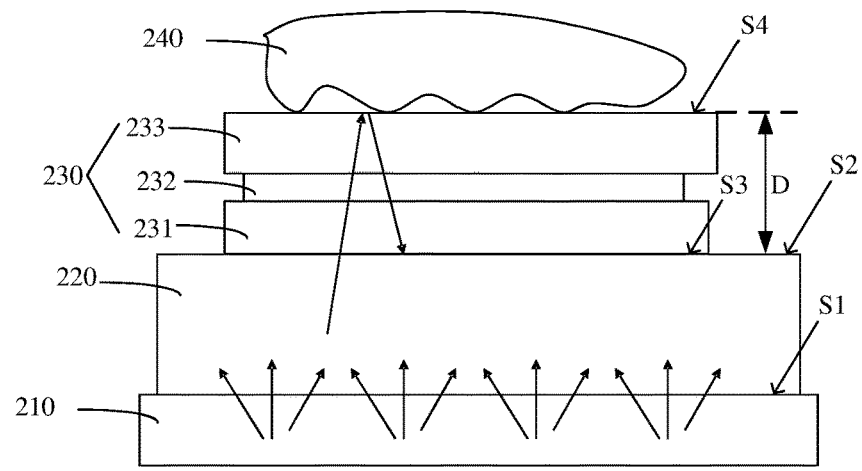
FIG. 2 schematically illustrates a cross-sectional view of an optical fingerprint module according to an embodiment of the present disclosure.
Figure 3:
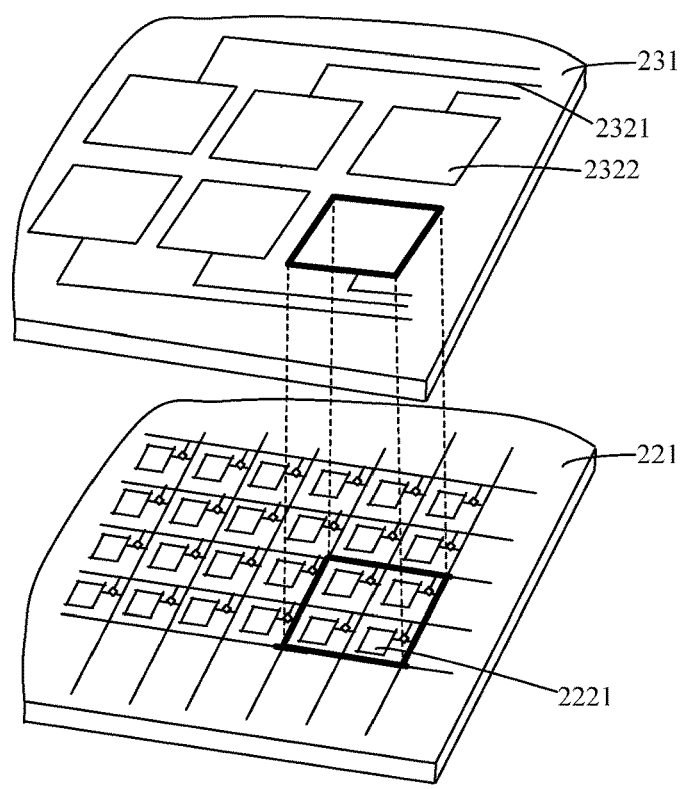
FIG. 3 schematically illustrates a structural diagram of an Organic Light Emitting Diode (OLED) display panel and an optical fingerprint sensor of the optical fingerprint module shown in FIG. 2.

An optical fingerprint module is provided according to an embodiment of the present disclosure. With reference to FIGS. 2 and 3, the optical fingerprint module may include a backlight source 210, an optical fingerprint sensor 220 and an OLED display panel 230. The optical fingerprint sensor 220 may be disposed between the OLED display panel 230 and the backlight source 210.

In some embodiment, the optical fingerprint sensor 220 may include a first surface S1, a second surface S2, at least one first non-opaque region (non shown) and a plurality of photosensitive pixels 2221 (referring to FIG. 3). The OLED display panel 230 may include a third surface S3, a fourth surface S4 and at least one second non-opaque region (not shown). Light emitted from the backlight source 210 at least partially passes through the at least one first non-opaque region from the first surface S1 and reaches the second surface S2, transmits from the second surface S2 to the third surface S3, passes through the at least one second non-opaque region from the third surface S3 and reaches the fourth surface S4. The light reaching the fourth surface S4 is at least partially reflected to be applied to capture a fingerprint image. The reflected light returns to the at least one second non-opaque region, reaches the third surface S3, transmits from the third surface S3 to the second surface S2, and enters the plurality of photosensitive pixels 2221 of the optical fingerprint sensor 220 from the second surface S2.

In some embodiment, the first surface S1 and the second surface S2 of the optical fingerprint sensor 220 are two outermost surfaces of the optical fingerprint sensor 220. Specifically, when the first surface S1 is an upper surface, the second surface S2 is a lower surface; and conversely, when the second surface S2 is an upper surface, the first surface S1 is a lower surface.

In some embodiment, the third surface S3 and the fourth surface S4 of the OLED display panel 230 are two outermost surfaces of the OLED display panel 230. Specifically, when the third surface S3 is an upper surface, the fourth surface S4 is a lower surface; and conversely, when the fourth surface S4 is an upper surface, the third surface S3 is a lower surface.

In some embodiment, the optical fingerprint sensor 220 may be an image sensor based on a glass substrate and manufactured by a Thin Film Transistor (TFT) process.

In some embodiment, light can uniformly pass through the OLED display panel 230, and the at least one second non-opaque regions 2221 are evenly distributed on a plan view of the OLED display panel 230. Similarly, light can uniformly pass through the optical fingerprint sensor 220, and the at least one first non-opaque region is evenly distributed on a plan view of the optical fingerprint sensor 220.

In some embodiment, an optical adhesive layer (not shown in FIGS. 2 and 3) may be disposed between the second surface S2 and the third surface S3. The optical adhesive layer can prevent multiple reflections and scatterings on interfaces between different substrates and air, thereby preventing resolution degradation of the fingerprint image. The optical adhesive layer may be made of a pressure-sensitive optical adhesive, a thermosensitive optical adhesive or a lightsensitive optical adhesive.

In some embodiment, sizes of the plurality of photosensitive pixels 2221 of the optical fingerprint sensor 220 may be less than or equal to 100 μm×100 μm, and a distance between the second surface S2 and the fourth surface S4 may be less than or equal to 0.5 mm. Normally, the backlight source 210 may emit stray light at various angles, and a distance D between the second surface S2 and the fourth surface S4 cannot be too large in order to capture a high-resolution fingerprint image. When the sizes of the plurality of photosensitive pixels 2221 of the optical fingerprint sensor 220 are 100 μm×100 μm, the distance D needs to be controlled below 0.5 mm. Normally, the smaller the sizes of the plurality of photosensitive pixels 2121, the smaller the distance D. Each of the plurality of photosensitive pixels 2221 may include at least one non-opaque region and at least one light blocking region, each of the at least one light blocking region may include a photosensitive device, the at least one non-opaque region may allow light to pass through the plurality of photosensitive pixels 2221, and may be a part of the at least one first non-opaque region.

In some embodiment, the OLED display panel 230 may include a first substrate 231 and a second substrate 233, and a stacked structure 232 disposed between the first substrate 231 and the second substrate 233. Light emitted from the backlight source 210 passes through the OLED display panel 230 along its thickness direction from a lower surface (i.e. the third surface S3) of the first substrate 231, reaches a contact interface between a finger and the upper surface (i.e. the fourth surface S4) of the second substrate 233, and is reflected and transmitted at the contact interface. The reflected light passes through the OLED display panel 230 again, irradiates onto the upper surface (i.e. the second surface S2) of the optical fingerprint sensor 220, and is absorbed by the plurality of photosensitive pixels 2221 in the optical fingerprint sensor 220 to generate an optical signal.

Since the OLED display panel 230 is a self-luminous device, an external light source is not required. The first substrate 231 and the second substrate 233 may be glass rigid substrates, or plastic film substrates such as polyimide (PI) or polyethylene terephthalate (PET) and so on, and the plastic film substrates are non-opaque, flexible and foldable.

In some embodiment, a sealant (not shown) may be disposed around the OLED display panel 230 and applied to seal the stacked structure 232 in the OLED display panel 230, so as to isolate moisture and air from the stacked structure 232.

In some embodiment, the first substrate 231 and the second substrate 233 may be as thin as tens of micrometers (μm) respectively, while a thickness of the stacked structure 232 may be only several μm, therefore a total thickness of the OLED display panel 230 may be as thin as 100 μm or less, to be flexible and foldable.

In some embodiment, the stacked structure 232 may include an anode layer (not shown), an organic light-emitting layer (not shown) and a cathode layer (not shown). At least one of the anode layer and the cathode layer may be made of a non-opaque material, for example, Indium Tin Oxides (ITO), graphene, nano-silver, carbon nanotube, aluminum-doped zinc oxide and so on, so that light can be emitted out.

Although not shown in FIGS. 2 and 3, in some embodiment, the stacked structure 232 may further include one or more of a Hole Injection Layer (HIL), a Hole Transporting Layer (HTL), an Electron Transporting Layer (ETL) and an Electron Injection Layer (EIL). These layers are added to form different energy level states, so that holes produced by the anode layer and electrons produced by the cathode layer can be more easily transferred to the organic light-emitting layer to be recombined, thereby making it easier to emit photons and improving the luminous efficiency. Appropriate amount of doping may be added to the HIL, the HTL, the organic light-emitting layer (EL), the ETL and the EIL to adjust required energy level states.

When both the anode layer and the cathode layer are non-opaque, the OLED display panel 230 is non-opaque (normally the HIL, the HTL, the ETL, and the EIL are all non-opaque). Then, when the OLED display panel 230 does not emit light (i.e. the OLED display panel 230 is turned off), the OLED display panel 230 itself is non-opaque, i.e. transparent. Even though the anode layer and the cathode layer are not all non-opaque, as long as at least a partial region of the stacked structure 232 can transmit light in its thickness direction, the OLED display panel 230 is non-opaque, i.e. transparent when not emitting light.

Referring to FIG. 3, a plurality of data lines (not marked) in a first axial direction and a plurality of scanning lines (not marked) in a second axial direction are disposed on a substrate 221 of the optical fingerprint sensor 220. The plurality of data lines and the plurality of scanning lines define a plurality of grid regions, and the plurality of photosensitive pixels 2221 arranged in an array are disposed in corresponding grid regions. Other configurations of the optical fingerprint sensor 220 are omitted in FIG. 3, but it should be noted that, the optical fingerprint sensor 220 may further include a peripheral circuit and so on, and the peripheral circuitry may include a driving circuit, a signal readout chip bonding region, a flexible printed circuit board bonding region, and lead wires connecting the chip readout chip bonding region and the flexible printed circuit board bonding region.

Referring to FIG. 3, the stacked structure 232 (not shown) is disposed on the first substrate 231, and the stacked structure 232 may include a plurality of isolated display pixels 2322. Each of the plurality of isolated display pixels may include a first electrode (not shown) and a second electrode (not shown), each first electrode is connected with an outside of a pixel region (not shown) where the each isolated display pixel 2322 is located via one of lead wires 2321, and all of the second electrodes are electrically connected as a common electrode of the entire surface. The plurality of isolated display pixels 2223 are individually connected with a corresponding control circuit via a lead wire 2321. In some embodiment, the first electrode, the second electrode and the lead wires 2321 may be made of non-opaque conductive materials.

In some embodiment, four of the plurality of photosensitive pixels 2221 may exactly face one of the plurality of isolated display pixels 2322, and the four photosensitive pixels 2221 may be arranged in an array of two rows and two columns. That is, each 2×2 photosensitive pixels 2221 may exactly face an isolated display pixel 2322, or each isolated display pixel 2322 may exactly face four photosensitive pixels 2221 in two rows and two columns. Then, a vertical projection of each isolated display pixel 2322 on the photosensitive pixel array covers corresponding four photosensitive pixels 2221. In FIG. 3, four dashed line shows the corresponding relationship (a vertical projection of an isolated display pixel 2322 on the photosensitive pixel array is represented by thickened and unlabeled lines). This kind of corresponding relationship enables light of the backlight source 210 to pass through the optical fingerprint sensor 220 and the OLED display panel 230 more easily to reach the fourth surface S4, and enables the light to pass through the optical fingerprint sensor 220 and the OLED display panel 230 more uniformly, thereby maintaining a fingerprint capturing function of the optical fingerprint module at a high level.

In other embodiments, one or two or more of the plurality of photosensitive pixels 2221 may exactly face one of the plurality of isolated display pixels 2322. When a photosensitive pixel 2221 exactly faces an isolated display pixel 2322, an area of the photosensitive pixel 2221 may be equal to an area of the isolated display pixel 2322.

In some embodiment, light emitted from the plurality of isolated display pixels may be any one of white light, violet light, blue light, cyan light, green light, yellow light, orange light, red light, or near-infrared light.

In other embodiments, each of the plurality of isolated display pixels 2322 may include three sub pixels, i.e. a red sub pixel, a green sub pixel and a blue sub pixel respectively, and each of the three sub pixels may be electrically connected with a corresponding driving circuit via a lead wire.

In some embodiment, a finger 240 may directly press an upper surface (i.e. the fourth surface S4) of the second substrate 233 of the OLED display panel 230. That is, the upper surface of the second substrate 233 of the OLED display panel 230 may be configured for a direct contact with fingers. When the finger 240 is directly pressing the fourth surface S4, light reaching the fourth surface S4 may be directly reflected and refracted at a contact interface between the finger 240 and the fourth surface S4 and an interface between air and the fourth surface S4, the generated reflection light may be applied to capture a fingerprint image, thereby achieving the aforementioned "the light reaching the fourth surface S4 is at least partially reflected to be applied to capture a fingerprint image".

It should be noted that, in other embodiments, the optical fingerprint module may further include a protective layer, and the OLED display panel 230 may be disposed between the protective layer and the optical fingerprint sensor 220, then fingers may be in direct contact with an outer surface of the protective layer, and the protective layer may be a single layer or multi-layers. When the finger 240 is directly pressing the protective layer, light reaching the fourth surface S4 may be directly reflected and refracted at a contact interface between the finger 240 and the protective layer and an interface between air and the protective layer, the generated reflection light may be applied to capture a fingerprint image, thereby achieving the aforementioned "the light reaching the fourth surface S4 is at least partially reflected to be applied to capture a fingerprint image".

In some embodiment, the backlight source 210 may be a surface light source, and the backlight source 210 may include structures like an LED (not shown), a light guide plate (not shown) and so on, and may also be other planar light-emitting structures.

In some embodiment, the backlight source 210 and the optical fingerprint sensor 220 may start operating and stop operating simultaneously, while the OLED display panel 230 may stop operating when the backlight source 210 and the optical fingerprint sensor 220 are operating. With such operating scheduling, the backlight source 210, the optical fingerprint sensor 220, and the OLED display panel 230 can coordinate with each other and achieve their respective functions in order.

It is difficult to combine the display function with the fingerprint capturing function, because the two functions may have an adverse affect on each other when being implemented. In the optical fingerprint module according to embodiments of the present disclosure, light emitted from the backlight source 210 at least partially passes through the at least one first non-opaque region from the first surface S1 and reaches the second surface S2, transmits from the second surface S2 to the third surface S3, passes through the at least one second non-opaque region from the third surface S3 and reaches the fourth surface S4. The light reaching the fourth surface S4 is at least partially reflected to be applied to capture a fingerprint image. The reflected light returns to the at least one second non-opaque region, reaches the third surface S3, transmits from the third surface S3 to the second surface S2, and enters the plurality of photosensitive pixels 2221 from the second surface S2. In addition, operating time of the optical fingerprint sensor 220 and operating time of the OLED display panel 230 are adjusted, so as to ensure that the OLED display panel 230 can display information well, and further to ensure that the optical fingerprint sensor 220 can capture fingerprint well. Therefore, the fingerprint capturing function and information display function can be integrated together in the optical fingerprint module, which broadens an application range of the optical fingerprint module.

That is, the optical fingerprint sensor 220 and the backlight source 210 according to embodiments of the present disclosure are disposed below the OLED display panel 230 by virtue of a characteristic property (i.e. a certain non-opaque property) of the OLED display panel 230, properties of the optical fingerprint sensor 220 and properties of backlight source 210, and functions of the OLED display panel 230 and functions of the optical fingerprint sensor 220 can be superimposed by a mutual cooperation of these structures in use, so that the entire optical fingerprint module not only has a fingerprint capturing function, but also has a information displaying function. When the optical fingerprint module captures fingerprint, a display function of the OLED display panel 230 is turned off, and the backlight source 210 emits light. Since the OLED display panel 230 has a certain non-opaque property, the optical fingerprint sensor 220 can capture fingerprint normally. When the optical fingerprint module displays information, the optical fingerprint sensor 220 and the backlight source 210 stop working, and a display function of the OLED display panel 230 is turned on.

In some embodiment, upper positions of the plurality of photosensitive pixels 2221 in the optical fingerprint sensor 220 correspond to lower positions of the plurality of isolated display pixels 2322 in the OLED display panel 230, so as to better ensure that light emitted from the backlight source 210 can reach the OLED display panel 230, and the light can pass through the optical fingerprint sensor 220 and the OLED display panel 230 more uniformly, thereby maintaining the fingerprint capturing function of the entire optical fingerprint module at a high level.

Figure 4:
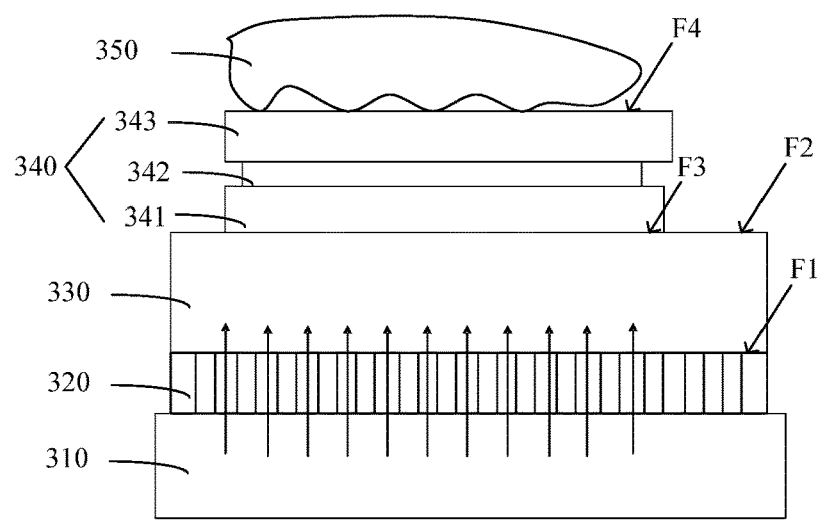
FIG. 4 schematically illustrates a cross-sectional view of an optical fingerprint module according to another embodiment of the present disclosure.
Figure 5:
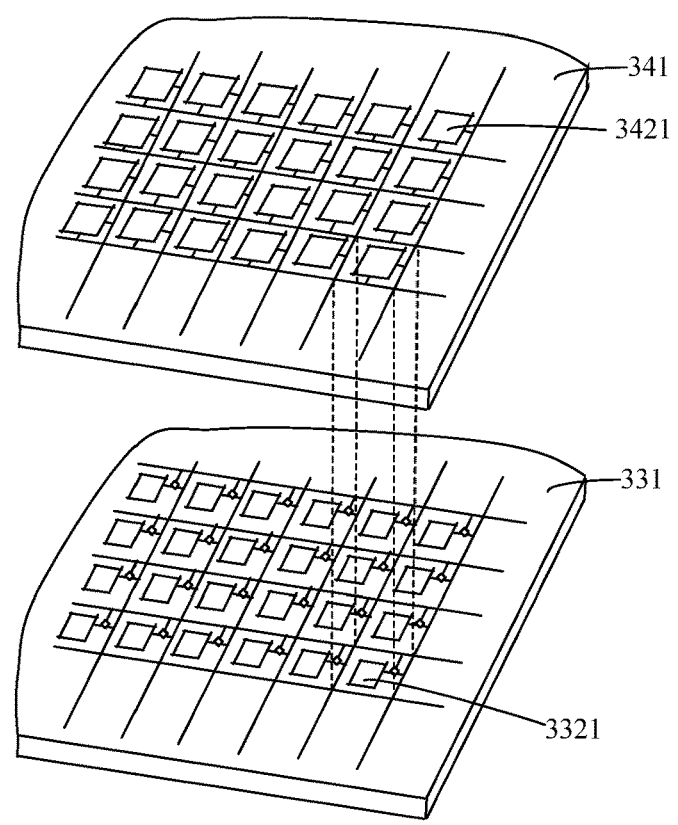
FIG. 5 schematically illustrates a structural diagram of an OLED display panel and an optical fingerprint sensor of the optical fingerprint module shown in FIG. 4.

An optical fingerprint module is provided according to another embodiment of the present disclosure. With reference to FIGS. 4 and 5, the optical fingerprint module may include a backlight source 310, an optical fingerprint sensor 330 and an OLED display panel 340. The optical fingerprint sensor 330 may be disposed between the OLED display panel 340 and the backlight source 310.

In some embodiment, the optical fingerprint sensor 330 may include a first surface F1, a second surface F2, at least one first non-opaque region (not shown) and a plurality of photosensitive pixels 3321 (referring to FIG. 5). The OLED display panel 340 may include a third surface F3, a fourth surface F4 and at least one second non-opaque region (not shown). Light emitted from the backlight source 310 at least partially passes through the at least one first non-opaque region from the first surface F1 and reaches the second surface F2, transmits from the second surface F2 to the third surface F3, passes through the at least one second non-opaque region from the third surface F3 and reaches the fourth surface F4. The light reaching the fourth surface F4 is at least partially reflected to be applied to capture a fingerprint image. The reflected light returns to the at least one second non-opaque region, reaches the third surface F3, transmits from the third surface F3 to the second surface F2, and enters the plurality of photosensitive pixels 3321 of the optical fingerprint sensor 330 from the second surface F2.

In some embodiment, the OLED display panel 340 may include a first substrate 341, a second substrate 343, and a stacked structure 342 disposed between the first substrate 341 and the second substrate 343.

Referring to FIG. 5, a plurality of first data lines (not marked) in a first axial direction and a plurality of second data lines (not marked) in a second axial direction are disposed on a substrate 331 of the optical fingerprint sensor 330. The plurality of first data lines and the plurality of second data lines define a plurality of grid regions, and the plurality of photosensitive pixels 3321 arranged in an array are disposed in corresponding grid regions. Other configurations of the optical fingerprint sensor 330 are omitted in FIG. 5, but it should be noted that, the optical fingerprint sensor 330 may further include a peripheral circuit and so on, and the peripheral circuitry may include a driving circuit, a signal readout chip bonding region, a flexible printed circuit board bonding region, and lead wires connecting the chip readout chip bonding region and the flexible printed circuit board bonding region.

Referring to FIG. 5, the stacked structure 342 (not shown in FIG. 5) may be disposed on the first substrate 341, and the stacked structure 342 may include a plurality of passive display pixels 3421 arranged in an array. Each of the plurality of passive display pixels 3421 may include a first electrode (not shown) and a second electrode (not shown), the first electrodes of each row of passive display pixels 3421 may be connected with a same first data line (not shown) in the first axial direction, and the second electrodes of each column of passive display pixels 3421 may be connected with a same second data line (not shown) in the second axial direction. The plurality of first data lines may be isolated from each other and the plurality of second data lines may be isolated from each other. The first electrodes, the second electrodes, the plurality of first data lines and the plurality of second data lines may be made of non-opaque conductive materials.

In some embodiment, one of the plurality of photosensitive pixels 3321 may exactly face one of the plurality of passive display pixels 3421. As shown in FIG. 5, two ends of the four dashed lines are respectively connected with four vertices of a photosensitive pixel 3321 and four vertices of a passive display pixel 3421, indicating that if the two pixels move along the dashed line, the two pixels can be basically coincident. In other embodiments, two or more of the plurality of photosensitive pixels 3321 may exactly face one of the plurality of passive display pixels 3421.

In some embodiment, light emitted from the plurality of passive display pixels 3421 may be any one of white light, violet light, blue light, cyan light, green light, yellow light, orange light, red light, or near-infrared light.

In other embodiments, each of the plurality of passive display pixels 3421 may include three sub pixels, i.e. a red sub pixel, a green sub pixel and a blue sub pixel respectively.

In some embodiment, a finger 350 may directly press an upper surface (i.e. the fourth surface F4) of the second substrate 343 of the OLED display panel 340. That is, the upper surface of the second substrate 343 of the OLED display panel 340 may be configured for a direct contact with fingers. It should be noted that, in other embodiments, the optical fingerprint module may further include a protective layer, and the OLED display panel 340 may be disposed between the protective layer and the optical fingerprint sensor 330, then fingers may be in direct contact with an outer surface of the protective layer. The protective layer may be a single layer or multi-layers.

In some embodiment, the backlight source 310 and the optical fingerprint sensor 330 may start operating and stop operating simultaneously, while the OLED display panel 340 may stop operating when the backlight source 310 and the optical fingerprint sensor 330 are operating. With such operating scheduling, the backlight source 310, the optical fingerprint sensor 330, and the OLED display panel 340 can coordinate with each other and achieve their respective functions in order.

In some embodiment, a light collimating layer 320 may be disposed between the backlight source 310 and the optical fingerprint sensor 330. Light emitted from the backlight source 310 is filtered by the light collimating layer 320 and becomes parallel light or quasi-parallel light, where the quasi-parallel light means that a maximum angle difference between all light rays is within ten degrees.

In other embodiment, the parallel light or quasi-parallel light emitted from the backlight source 310 may be transmitted to the optical fingerprint sensor 330 at an oblique incident angle.

In some embodiment, the light collimating layer 320 only allows light within a certain range of angles to pass.

In some embodiment, the light collimating layer 320 may include a light blocking frame (not shown) and a plurality of non-opaque holes (not shown) uniformly distributed in the light blocking frame. Stray light will be absorbed by the light blocking frame when entering the plurality of non-opaque holes, thereby allowing only light at a relatively vertical angle to pass, so that the light collimating layer 320 can achieve an effect of light collimating.

Therefore, the light emitted from the backlight source 310 may become parallel light or quasi-parallel light after being filtered by the light collimating layer 320. The parallel light or quasi-parallel light is more beneficial to obtain high-resolution and high-quality fingerprint images.

In other embodiment, the light emitted from the backlight source 310 may be transmitted to a bottom surface, i.e. the first surface F1 of the optical fingerprint sensor 330 at a vertical incident angle after being filtered by the light-collimating layer 320, thereby further improving quality of fingerprint images.

In some embodiment, an optical adhesive layer (not shown) may be disposed between the second surface F2 and the third surface F3. The optical adhesive layer can prevent multiple reflections and scatterings on interfaces between different substrates and air, thereby preventing definition of the fingerprint image from decreasing. The optical adhesive layer may be made of a pressure-sensitive optical adhesive, a thermosensitive optical adhesive or a lightsensitive optical adhesive.

In some embodiments, a total thickness of the OLED display panel 340 and the optical adhesive layer may be less than or equal to 5 mm. Since the light emitted from the backlight source 310 is parallel light or quasi-parallel light, it is not easy for the light rays reflected by the fourth surface F4 to interfere with each other. Therefore, a thickness between the third surface F3 and the fourth surface F4 may generally have a larger selection range. However, the total thickness of the OLED display panel 340 and the optical adhesive layer is normally controlled to be less than or equal to 5 mm taking into account of a size and a weight of a final product.

In other embodiment, the light collimating layer 320 may be replaced with a light focusing layer. The light focusing layer may be applied to filter light emitted from the backlight source 310 so that the light may become parallel light or quasi-parallel light, where the quasi-parallel light means that a maximum angle difference between all light rays is within ten degrees. The light focusing layer may be one or more lens layers, the lens layer may achieve a focusing effect by adjusting light angles to make angle differences between different light rays reduced, thereby adjusting the light to be quasi-parallel light. A plurality of lens layers may also be used to make light rays parallel to each other, which can also adjust light emitted from the backlight source 310 to be parallel light.

More information on structures and advantages of the optical fingerprint module according to embodiments shown in FIGS. 4 and 5 may refer to corresponding descriptions in aforementioned embodiments.

Figure 6:
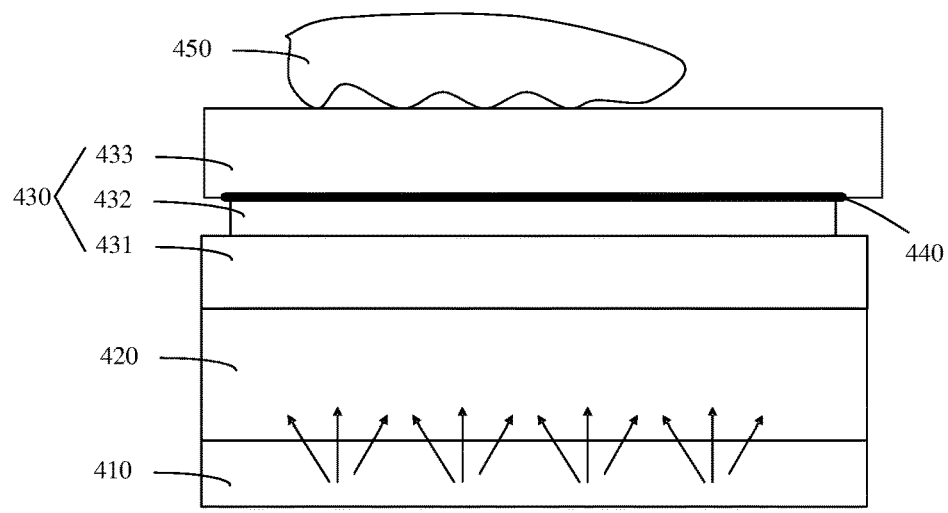
FIG. 6 schematically illustrates a cross-sectional view of an optical fingerprint module according to another embodiment of the present disclosure.
Figure 7:
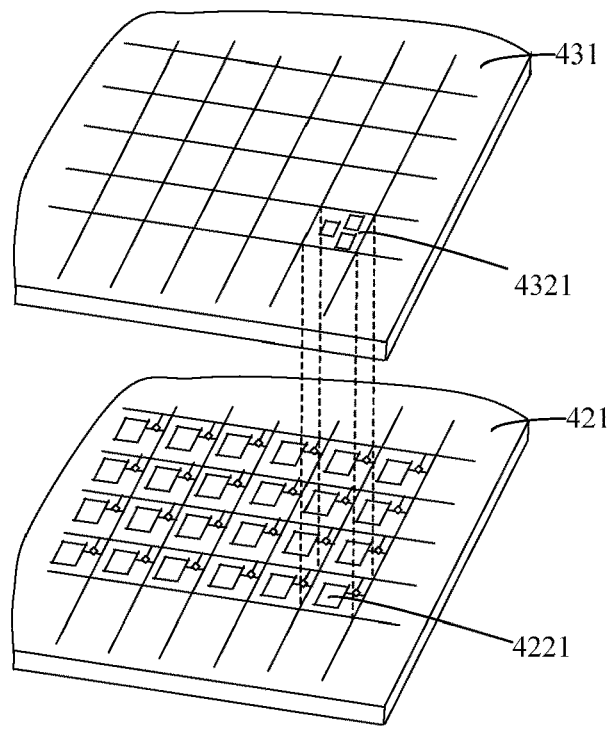
FIG. 7 schematically illustrates a structural diagram of an OLED display panel and an optical fingerprint sensor of the optical fingerprint module shown in FIG. 6.

An optical fingerprint module is provided according to another embodiment of the present disclosure. With reference to FIGS. 6 and 7, the optical fingerprint module may include a backlight source 410, an optical fingerprint sensor 420 and an OLED display panel 430. The optical fingerprint sensor 420 may be disposed between the backlight source 410 and the OLED display panel 430.

In some embodiment, the optical fingerprint sensor 420 may include a first surface (now shown), a second surface (now shown), at least one first non-opaque region (not shown) and a plurality of photosensitive pixels 4221 (referring to FIG. 7). The OLED display panel 430 may include a third surface (now shown), a fourth surface (now shown) and at least one second non-opaque region (not shown). Light emitted from the backlight source 410 at least partially passes through the at least one first non-opaque region from the first surface and reaches the second surface, transmits from the second surface to the third surface, passes through the at least one second non-opaque region from the third surface and reaches the fourth surface. The light reaching the fourth surface is at least partially reflected to be applied to capture a fingerprint image. The reflected light returns to the at least one second non-opaque region, reaches the third surface, transmits from the third surface to the second surface, and enters the plurality of photosensitive pixels 4221 of the optical fingerprint sensor 420 from the second surface.

In some embodiment, the optical fingerprint sensor 420 may be disposed between the OLED display panel 430 and the backlight source 410.

In some embodiment, the OLED display panel 430 may include a first substrate 431 and a second substrate 433, and a stacked structure 432 disposed between the first substrate 431 and the second substrate 433.

Referring to FIG. 7, a plurality of data lines (not marked) in a first axial direction and a plurality of scanning lines (not marked) in a second axial direction are disposed on a substrate 421 of the optical fingerprint sensor 420. The plurality of data lines and the plurality of scanning lines define a plurality of grid regions, and the plurality of photosensitive pixels 4221 arranged in an array are disposed in corresponding grid regions. Other configurations of the optical fingerprint sensor 420 are omitted in FIG. 7, but it should be noted that, the optical fingerprint sensor 420 may further include a peripheral circuit and so on, where the peripheral circuitry may include a driving circuit, a signal readout chip bonding region, a flexible printed circuit board bonding region, and lead wires connecting the chip readout chip bonding region and the flexible printed circuit board bonding region.

Referring to FIG. 7, the stacked structure 432 (not shown in FIG. 7) may be disposed on the first substrate 431, and the stacked structure 432 may include a plurality of active display pixels 4321 arranged in an array. Each of the plurality of active display pixels 4321 may include a first electrode (not shown), a second electrode (not shown) and one or more Thin Film Transistor (TFT) devices (not shown), and each of the plurality of active display pixels 4321 may be connected with a data line (not shown) and a scanning line (not shown) via the one or more TFT devices. The first electrodes and the second electrodes may be made of non-opaque conductive materials.

In some embodiment, one of the plurality of photosensitive pixels 4221 may exactly face one of the plurality of active display pixels 4321, and the alignment manner is shown in FIG. 7. In other embodiments, two or more of the plurality of photosensitive pixels 4221 may exactly face one of the plurality of active display pixels 4321.

In some embodiment, a finger 450 may directly press an upper surface (i.e. the fourth surface) of the second substrate 433 of the OLED display panel 430. That is, the upper surface of the second substrate 433 of the OLED display panel 430 may be configured for a direct contact with fingers. It should be noted that, in other embodiments, the optical fingerprint module may further include a protective layer, and the OLED display panel 430 may be disposed between the protective layer and the optical fingerprint sensor 420, then fingers may be in direct contact with an outer surface of the protective layer, and the protective layer may be a single layer or multi-layers.

In some embodiments, a touch-sensitive layer 440 may be disposed between the second substrate 433 and the stacked structure 432, and provides the entire optical fingerprint module with a touch sensitive function, so that an application range of the optical fingerprint module can be broadened. In other embodiments, the optical fingerprint module may further include the aforementioned protective layer, and a touch-sensitive layer may be disposed between the second non-opaque substrate 433 and the protective layer.

In some embodiment, the backlight source 410 and the optical fingerprint sensor 420 may start operating and stop operating simultaneously, while the OLED display panel 430 may stop operating when the backlight source 410 and the optical fingerprint sensor 420 are operating. With such operating scheduling, the backlight source 410, the optical fingerprint sensor 420, and the OLED display panel 430 can coordinate with each other and achieve their respective functions in order. An operating time of the touch-sensitive layer 440 does not conflict with an operating time of the OLED display panel 430. Therefore, it is not necessary to consider an operating time match between the touch-sensitive layer 440 and the OLED display panel 430. Likewise, the operating time of the touch-sensitive layer 440 does not conflict with an operating time of the backlight source 410 and an operating time of the optical fingerprint sensor 420. Therefore, it is not necessary to consider an operating time match of the touch-sensitive layer 430, the backlight source 410 and the optical fingerprint sensor 420.

Referring to FIG. 7, in some embodiment, each of the plurality of active display pixels 4321 may include an element region (not shown), an electrode region (not shown) and a surrounding region (not shown). For example, the element region, the electrode region and the surrounding region may be respectively a small rectangular area in an area enclosed by the active display pixel 4321 shown in FIG. 7. In some embodiment, the element region may be a light blocking region, the surrounding region may be a non-opaque region, and the surrounding region may be a part of the second non-opaque region. The electrode region may be a non-opaque region or a light blocking region. When the electrode region is a non-opaque region, the electrode region may be a part of the second non-opaque region.

More information on structures and advantages of the optical fingerprint module according to embodiments shown in FIGS. 6 and 7 may refer to corresponding descriptions of the foregoing embodiments.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

The invention claimed is:
1. An optical fingerprint module comprising:
a backlight source; and
an optical fingerprint sensor comprising a first surface, a second surface, at least one first non-opaque region and a plurality of photosensitive pixels;
wherein the optical fingerprint module further comprises: an Organic Light Emitting Diode (OLED) display panel comprising a third surface, a fourth surface and at least one second non-opaque region;
wherein the optical fingerprint sensor is disposed between the OLED device panel and the backlight source;
wherein light emitted from the backlight source at least partially passes through the at least one first non-opaque region from the first surface and reaches the second surface, transmits from the second surface to the third surface, passes through the at least one second non-opaque region from the third surface and reaches the fourth surface, the light reaching the fourth surface is at least partially reflected to be applied to capture a fingerprint image, and the reflected light returns to the at least one second non-opaque region, reaches the third surface, transmits from the third surface to the second surface, and enters the plurality of photosensitive pixels from the second surface.

2. The optical fingerprint module according to claim 1, wherein an optical adhesive layer is disposed between the second surface and the third surface.

3. The optical fingerprint module according to claim 2, wherein pixel sizes of the optical fingerprint sensor are less than or equal to 100 μm×100 μm, and a distance between the second surface and the fourth surface is less than or equal to 0.5 mm.

4. The optical fingerprint module according to claim 1, wherein a light collimating layer or a light focusing layer is disposed between the backlight source and the optical fingerprint sensor, and is configured to make light transmitting to the first surface become parallel light or quasi-parallel light.

5. The optical fingerprint module according to claim 1, wherein an optical adhesive layer is disposed between the second surface and the third surface, a total thickness of the OLED display panel and the optical adhesive layer is below 5 mm.

6. The optical fingerprint module according to claim 1, wherein the OLED display panel comprises a first substrate, a second substrate, and a stacked structure disposed between the first substrate and the second substrate.

7. The optical fingerprint module according to claim 6, wherein the stacked structure comprises a plurality of isolated display pixels, each of the plurality of isolated display pixels comprises a first electrode and a second electrode, the first electrode is connected to an outside of a pixel region where the each isolated display pixel is disposed through a lead, and all of the second electrodes are electrically connected together.

8. The optical fingerprint module according to claim 7, wherein one or more of the plurality of photosensitive pixels exactly face one of the plurality of isolated display pixels; and when one of the plurality of photosensitive pixels exactly faces one of the plurality of isolated display pixels, an area of each of the plurality of photosensitive pixels is equal to an area of each of the plurality of isolated display pixels.

9. The optical fingerprint module according to claim 7, wherein the first electrode, the second electrode and the lead are made of non-opaque conductive materials.

10. The optical fingerprint module according to claim 7, wherein light emitted from the plurality of isolated display pixels comprises white light, violet light, blue light, cyan light, green light, yellow light, orange light, red light, or near-infrared light; or each of the plurality of isolated display pixels comprises three sub pixels, and the three sub pixels comprise a red sub pixel, a green sub pixel, and a blue sub pixel respectively.

11. The optical fingerprint module according to claim 6, wherein the stacked structure comprises a plurality of passive display pixels arranged in an array, each of the plurality of passive display pixels comprises a first electrode connected with a first data line in a first axial direction and a second electrode connected with a second data line in a second axial direction.

12. The optical fingerprint module according to claim 6, wherein the stacked structure comprises a plurality of active display pixels arranged in an array, each of the plurality of active display pixels is connected with a data line and a scanning line.

13. The optical fingerprint module according to claim 12, wherein each of the plurality of active display pixels comprises an element region, an electrode region and a surrounding region, the element region is a light blocking region, and the surrounding region is a non-opaque region.

14. The optical fingerprint module according to claim 6, wherein when the optical fingerprint sensor captures fingerprint, a display function of the OLED display panel is turned off.

15. The optical fingerprint module according to claim 6, further comprising a protective layer, wherein the OLED display panel is disposed between the protective layer and the optical fingerprint sensor.

16. The optical fingerprint module according to claim 15, wherein a touch-sensitive layer is disposed between the second substrate and the protective layer, or between the second substrate and the stacked layer.

* * * * *